(12) United States Patent
Filippini et al.

(10) Patent No.: US 9,356,095 B2
(45) Date of Patent: **\*May 31, 2016**

(54) VERTICAL DEVICES AND METHODS OF FORMING

(71) Applicant: Micron Technology, Inc., Boise, ID (US)

(72) Inventors: Andrea Filippini, Turate (IT); Luca Ferrario, Ferno (IT); Marcello Mariani, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/748,527

(22) Filed: Jun. 24, 2015

(65) Prior Publication Data

US 2015/0295031 A1    Oct. 15, 2015

Related U.S. Application Data

(63) Continuation of application No. 14/021,445, filed on Sep. 9, 2013, now Pat. No. 9,087,895, which is a continuation of application No. 13/204,763, filed on Aug. 8, 2011, now Pat. No. 8,530,312.

(51) Int. Cl.

| | |
|---|---|
| *H01L 21/336* | (2006.01) |
| *H01L 21/28* | (2006.01) |
| *H01L 21/76* | (2006.01) |
| *H01L 29/78* | (2006.01) |

(Continued)

(52) U.S. Cl.
CPC ...... *H01L 29/0649* (2013.01); *H01L 21/31111* (2013.01); *H01L 21/76224* (2013.01); *H01L 27/1027* (2013.01); *H01L 27/10841* (2013.01); *H01L 27/10876* (2013.01); *H01L 29/66666* (2013.01); *H01L 29/7827* (2013.01); *H01L 27/10802* (2013.01)

(58) Field of Classification Search
CPC .................. H01L 29/7827; H01L 29/66666
USPC .......... 438/243, 244, 270, 589, 674; 257/228, 257/229, 330, 332, E21.19, E21.41, 257/E21.249, E21.646
See application file for complete search history.

(56) References Cited

U.S. PATENT DOCUMENTS

| | | | |
|---|---|---|---|
| 6,072,209 | A | 6/2000 | Noble et al. |
| 7,785,961 | B2 | 8/2010 | Noble |

(Continued)

OTHER PUBLICATIONS

Dobkin, Daniel M. "High Density Plasma Deposition of SiO2." http://www.enigmatic-consulting.com/semiconductor_processing/CVD_Fundamentals/films/HDP_SiO2.html. Accessed May 13, 2011 (5 pages).

(Continued)

*Primary Examiner* — Dao H Nguyen
(74) *Attorney, Agent, or Firm* — Brooks, Cameron & Huebsch, PLLC

(57) ABSTRACT

Vertical devices and methods of forming the same are provided. One example method of forming a vertical device can include forming a trench in a semiconductor structure, and partially filling the trench with an insulator material. A dielectric material is formed over the insulator material. The dielectric material is modified into a modified dielectric material having an etch rate greater than an etch rate of the insulator material. The modified dielectric material is removed from the trench via a wet etch.

20 Claims, 12 Drawing Sheets

(51) Int. Cl.
*H01L 29/06* (2006.01)
*H01L 21/311* (2006.01)
*H01L 29/66* (2006.01)
*H01L 27/102* (2006.01)
*H01L 21/762* (2006.01)
*H01L 27/108* (2006.01)

(56) References Cited

U.S. PATENT DOCUMENTS

| | | | |
|---|---|---|---|
| 7,892,912 B2 * | 2/2011 | Kim | 438/212 |
| 7,897,440 B1 | 3/2011 | Horch | |
| 7,906,397 B2 | 3/2011 | Song et al. | |
| 8,530,312 B2 * | 9/2013 | Filippini et al. | 438/270 |
| 9,087,895 B2 * | 7/2015 | Filippini | H01L 21/31111 |
| 2006/0205164 A1 | 9/2006 | Ko et al. | |
| 2006/0289926 A1 * | 12/2006 | Matsuno | H01L 27/11521 257/316 |
| 2007/0212874 A1 | 9/2007 | Sandhu | |
| 2008/0014711 A1 * | 1/2008 | Choi | H01L 21/76229 438/424 |
| 2010/0052094 A1 | 3/2010 | Carter et al. | |
| 2010/0078757 A1 | 4/2010 | Eun | |
| 2010/0267172 A1 | 10/2010 | Xiao et al. | |
| 2011/0049669 A1 * | 3/2011 | Lee | H01L 21/76232 257/510 |
| 2011/0068398 A1 | 3/2011 | Anderson et al. | |
| 2012/0052640 A1 * | 3/2012 | Fischer | H01L 21/823425 438/268 |
| 2012/0135573 A1 * | 5/2012 | Kim | H01L 27/10873 438/270 |

OTHER PUBLICATIONS

Lee, Ji Youn, et al. "Boron Back Surface Field Using Spin-On Dopants by Rapid Thermal Processing." Journal of the Korean Physical Society, Jun. 2004. vol. 44, No. 6, pp. 1581-1586.

Zhu, Z.-T., et al. "Spin on dopants for high-performance single-crystal silicon transistors on flexible plastic substrates." Applied Physics Letters, Mar. 23, 2005. vol. 86, Issue 13 (3 pages).

* cited by examiner

VERTICAL DEVICES AND METHODS OF FORMING

PRIORITY APPLICATION INFORMATION

This application is a Continuation of U.S. application Ser. No. 14/021,445 filed Sep. 9, 2013, which is a Continuation of U.S. application Ser. No. 13/204,763 filed Aug. 8, 2011, now U.S. Pat. No. 8,530,312, all of which are incorporated herein by reference.

TECHNICAL FIELD

The present disclosure relates generally to semiconductor devices and methods, and more particularly to vertical devices and methods of forming.

BACKGROUND

Memory devices can be provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory, thyristor RAM (T-RAM), and flash memory, among others.

Fabrication of the different types of memory can include using shallow trench isolation (STI) to electrically isolate conductive semiconductor regions, e.g., lines, pillars, from each other. Fabrication, e.g., patterning and etching processes, then continue to form devices such as transistors, thyristors, and/or capacitors associated with particular memory types and/or components thereof.

Some vertical devices, such as transistors and/or thyristors can be formed having one or more gate structures. However, forming a gate structure adjacent a vertical device can be challenging. For example, it can be difficult to form a vertical gate at a desired height within an STI without causing undesirable effects such as unwanted and/or unintentional removal of hard mask material associated with the fabrication process and/or field oxide, for instance.

DETAILED DESCRIPTION

Figure 1:
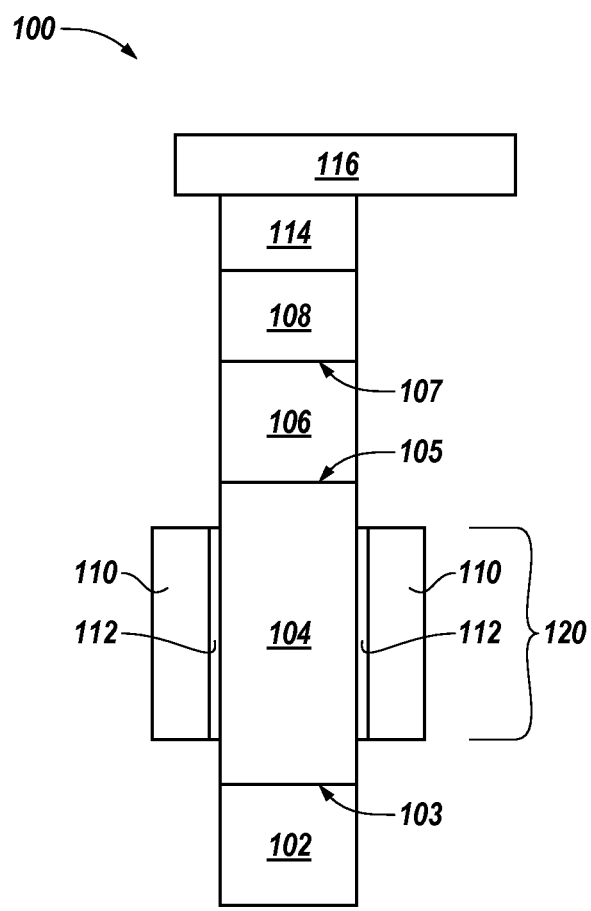
FIG. 1 illustrates a cross-sectional view of a thyristor-based vertical memory cell that can be formed in accordance with embodiments of the present disclosure.

Vertical devices and methods of forming the same are provided. One example method of forming a vertical device can include forming a trench in a semiconductor structure, and partially filling the trench with an insulator material. A dielectric material is formed over the insulator material. The dielectric material is modified into a modified dielectric material having an etch rate greater than an etch rate of the insulator material. The modified dielectric material is removed from the trench via a wet etch.

One or more embodiments of the present disclosure include partially filling trenches, e.g., STI trenches, while avoiding use of dry etching and wet etching processes having an associated duration that can cause unwanted consumption of semiconductor, insulator, and/or patterning materials. Although the fabrication process described in connection with the figures relates to a thyristor-based vertical memory cell, embodiments of the present disclosure are not limited to a particular memory device type. For instance, various methods and structures described herein can be applied to fabrication of other vertical and/or horizontally-fabricated devices formed by partially filling a trench. Such devices can include, but are not limited to, DRAM, T-RAM, and/or MOS transistor devices, which may involve different materials and/or configurations than those described in association with the examples described herein.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Memory devices are utilized as volatile and non-volatile memory for a wide range of electronic applications in need of high memory densities, high reliability, and data retention without power. Non-volatile memory may be used in, for example, personal computers, portable memory sticks, solid state drives (SSDs), digital cameras, cellular telephones, portable music players such as MP3 players, movie players, and other electronic devices.

A vertical memory cell can include an electrically floating body region adjacent one or more control gates. The electrically floating body region can store electrical charge. The presence or absence of electrical charge stored in the electrically floating body region may represent a logic high or binary "1" data state or a logic low or binary "0" data state respectively.

A vertical device is often fabricated using a number of patterning and etching processes. A semiconductor pillar can be formed and a gate structure can be subsequently fabricated adjacent the semiconductor pillar. A vertical device can be configured to have the gate structure located some distance from one end of the semiconductor pillar, e.g., near an intermediate point of the semiconductor pillar. For instance, the gate structure can be raised some distance from one end of the semiconductor pillar by being fabricated on an insulator material of an appropriate height as a spacer.

However, fabricating the insulator material spacer to be a desired distance from one end of the semiconductor pillar can be challenging for several reasons including depositing the insulator material can result in some insulator material being unintentionally deposited on the side walls of the semiconductor pillar, and/or etching the deposited insulator material can also unintentionally etch other features. Silicon nitride hard masks can be used for patterning and in forming a vertical memory cell. Long wet etching processes and dry etching may cause unwanted silicon nitride hard mask consumption, among other unintended consequences.

FIG. 1 illustrates a cross-sectional view of a thyristor-based vertical memory cell that can be formed in accordance with embodiments of the present disclosure. FIG. 1 shows a vertical thyristor-based 1T DRAM cell 100 having an N+ doped material 102, a P−doped material 104, an N− doped material 106, a P+ doped material 108, a contact material 114, and a conductive, e.g., metal, material 116. For example, the conductive material 116 can be a data line, e.g., bit line. Between the N+ doped material 102 and the P−doped material 104 is a junction 103. Between the P−doped material 104 and the N−doped material 106 is a junction 105. Between the N− doped material 106 and the P+ doped material 108 is a junction 107. Embodiments are not limited to this example. Different dopings can be used than those provided above. The quantity and/or arrangement of the various doped regions can be different than that described above, such that different types of vertical devices can be formed thereby.

A gate structure is formed adjacent a portion of the P−doped material 104 including a conductive material 110 separated from the P−doped material 104 by a gate insulator material 112. The portion of the P−doped material 104 adjacent the gate structure is referred to as a body region 120.

Figure 2A:
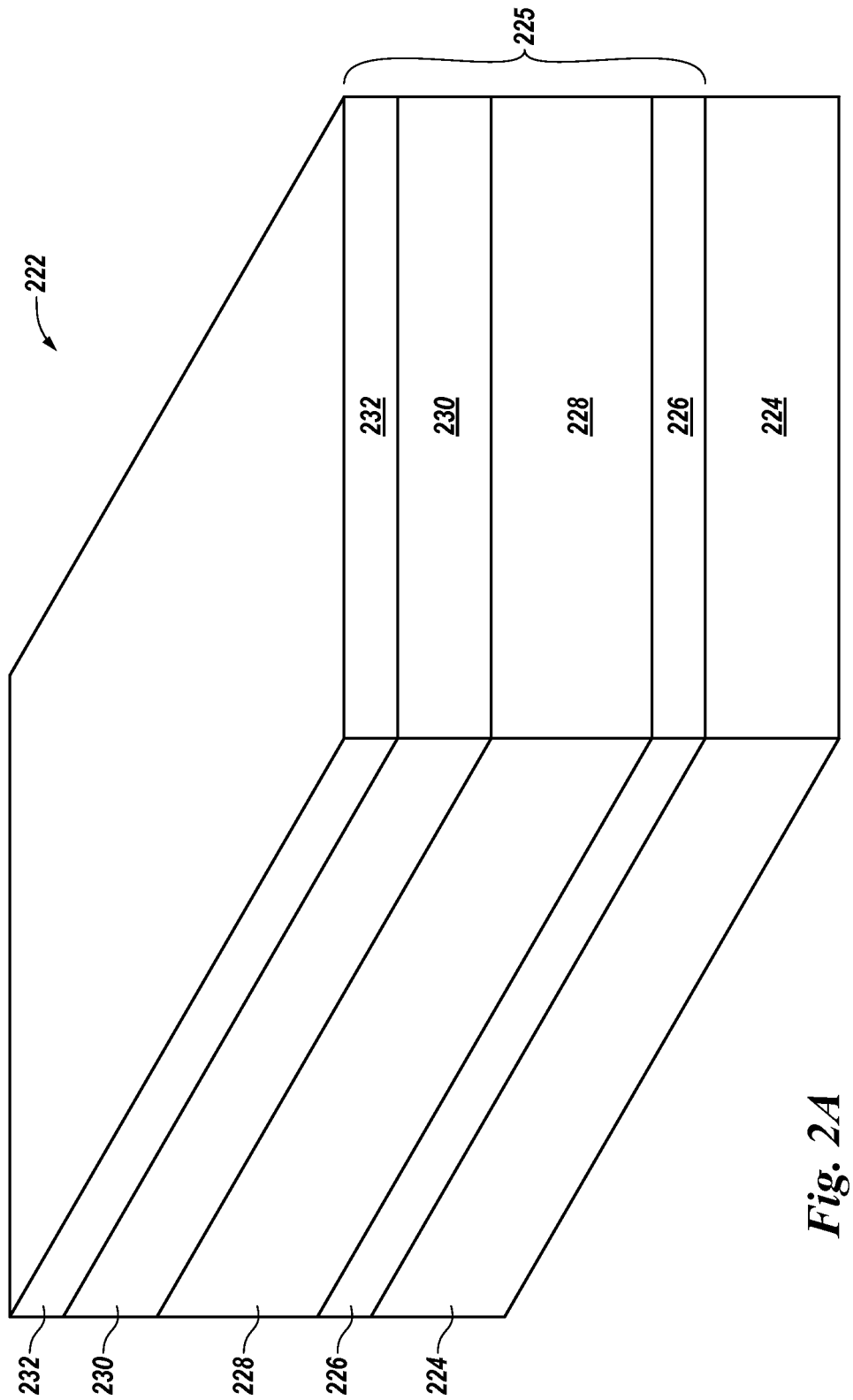
FIGS. 2A-2D illustrate cross-sectional perspective views of various process stages associated with forming a vertical device in accordance with embodiments of the present disclosure.

FIGS. 2A-2D illustrate cross-sectional perspective views of various process stages associated with forming a vertical device in accordance with embodiments of the present disclosure. FIG. 2A shows a semiconductor structure 222 associated with forming a number of vertical devices. The semiconductor structure 222 can include a semiconductor structure 225 formed over a substrate 224.

Although not shown individually in FIG. 2A, the substrate 224 can include a number of materials. For instance, the substrate 224 can include a buried oxide. The buried oxide can comprise, for example, an insulator material on a base semiconductor substrate. The base semiconductor substrate can be a full or partial wafer of semiconductor material such as silicon, gallium arsenide, indium phosphide, etc., a full or partial silicon-metal-on-insulator (SMOI) type substrate, such as a silicon-on-glass (SOG), silicon-on-ceramic (SOC), or silicon-on-sapphire (SOS) substrate, or other suitable fabrication substrate. As used herein, the term "wafer" includes conventional wafers as well as other bulk semiconductor substrates. The insulator material may be a dielectric material, for example, including silicon dioxide, borophosphosilicate glass (BPSG), borosilicate glass (BSG), and/or phosphosilicate glass (PSG).

The substrate 224 can be a semiconductor-on-insulator (SOI) or semiconductor-metal-on-insulator (SMOI) configuration. However, embodiments of the present disclosure are not limited to a particular substrate 224 and/or constituency and/or arrangement thereof, and may include other substrate 224 configurations appropriate to vertical devices associated with vertical memory cells, for instance.

The semiconductor structure 225 can include materials 226, 228, 230, and 232, as shown in FIG. 2A. Materials 226, 228, 230, and/or 232 can be doped or undoped. According to various embodiments, material 226 can be an N+doped material, material 228 can be a P−doped material, material 230 can be an N-doped material, and material 232 can be a P+ doped material. A junction can be located between the various materials, such as those indicated in FIG. 1. According to some embodiments, the N+ doped material 226 can be a cathode of a vertical memory cell.

Materials 226, 228, 230, and 232 can be separately deposited, and/or can be deposited in bulk and subsequently appropriately doped to establish individually doped regions. Embodiments of the present disclosure are not limited to the configuration described above and/or shown in FIG. 2A. That is, the number, arrangement, and/or doping of various regions of the semiconductor structure 225 can be different than that shown in FIG. 2A.

The materials described herein may be formed by various techniques including, but not limited to, spin coating, blanket coating, chemical vapor deposition (CVD) such as low pressure CVD or plasma enhanced CVD, plasma enhanced chemical vapor deposition (PECVD), atomic layer deposition (ALD), plasma enhanced ALD, physical vapor deposition (PVD), thermal decomposition, and/or thermal growth, among others. Alternatively, materials may be grown in situ. While the materials described and illustrated herein may be formed as layers, the materials are not limited thereto and may be formed in other three-dimensional configurations.

The materials 226, 228, 230, and/or 232 can be, for example, materials such as germanium (Ge), silicon (S), silicon carbide (SiC), and/or gallium nitride (GaN), among various other semiconductor materials or combinations thereof. According to some embodiments, material(s) comprising semiconductor structure 225 can be deposited separately, or in bulk. According to some embodiments, with respect to any of materials 226, 228, 230, and/or 232, a precursor semiconductor material may be deposited and subsequently implanted with an atomic species to form a particular doped material and/or region.

Figure 2B:
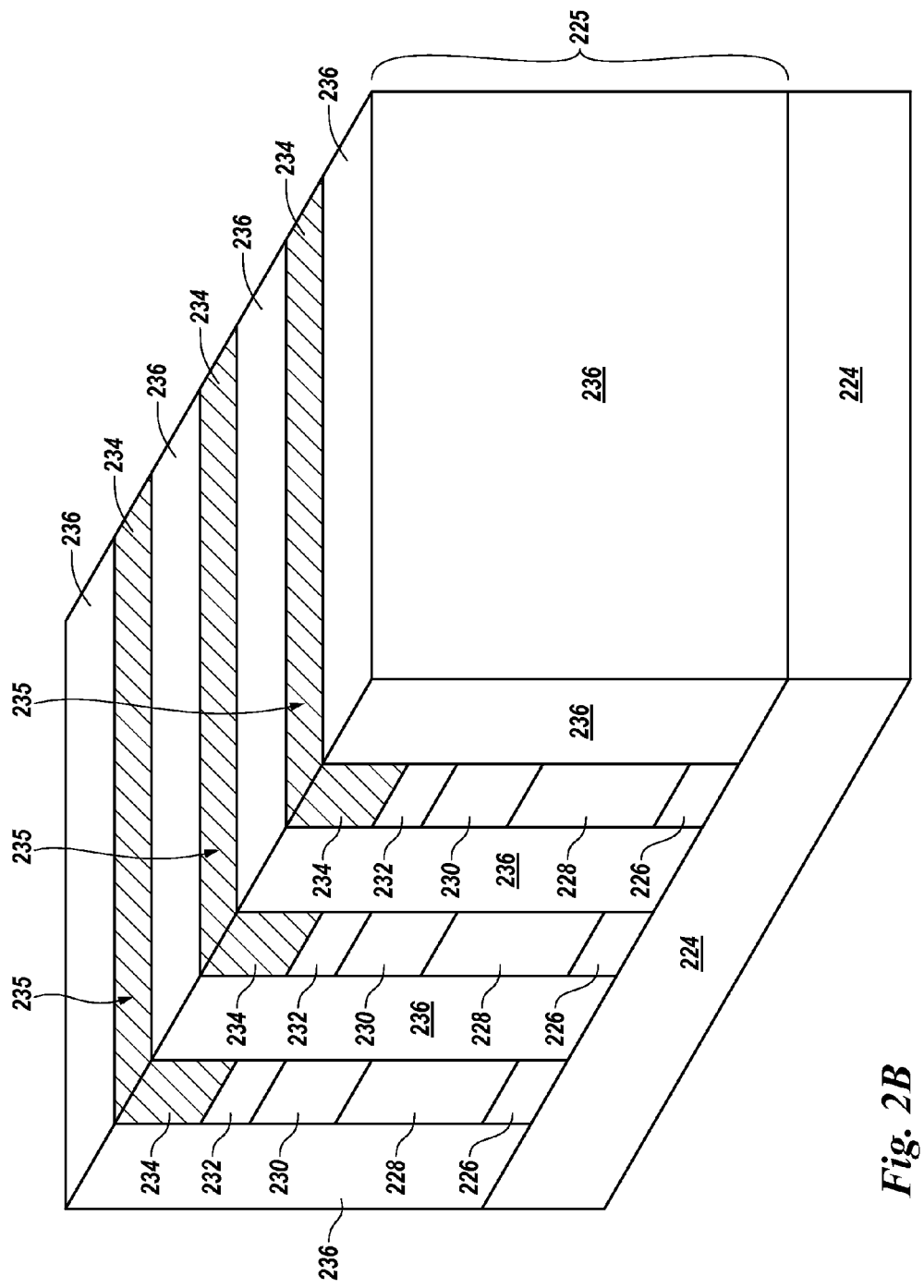

FIG. 2B illustrates the semiconductor structure 222 of FIG. 2A at a subsequent processing stage. As shown in FIG. 2B, the semiconductor structure 225 can be patterned and fabricated into semiconductor lines 235. That is, trenches for isolation, e.g., STI trenches, can be formed in the semiconductor structure 225. For example, a mask material 234 can be applied, e.g., patterned, over portions of the semiconductor structure 225. The mask material 234 can be silicon nitride, for example.

STI trenches can be formed by removing, e.g., etching, portions of materials 226, 228, 230, and 232 of the semiconductor structure 225 not protected by mask material 234. The trenches can be filled with a field oxide material 236, such as a silicon oxide or other insulating material. According to some embodiments, this first STI process can form trenches in a bit-line direction.

Figure 2C:
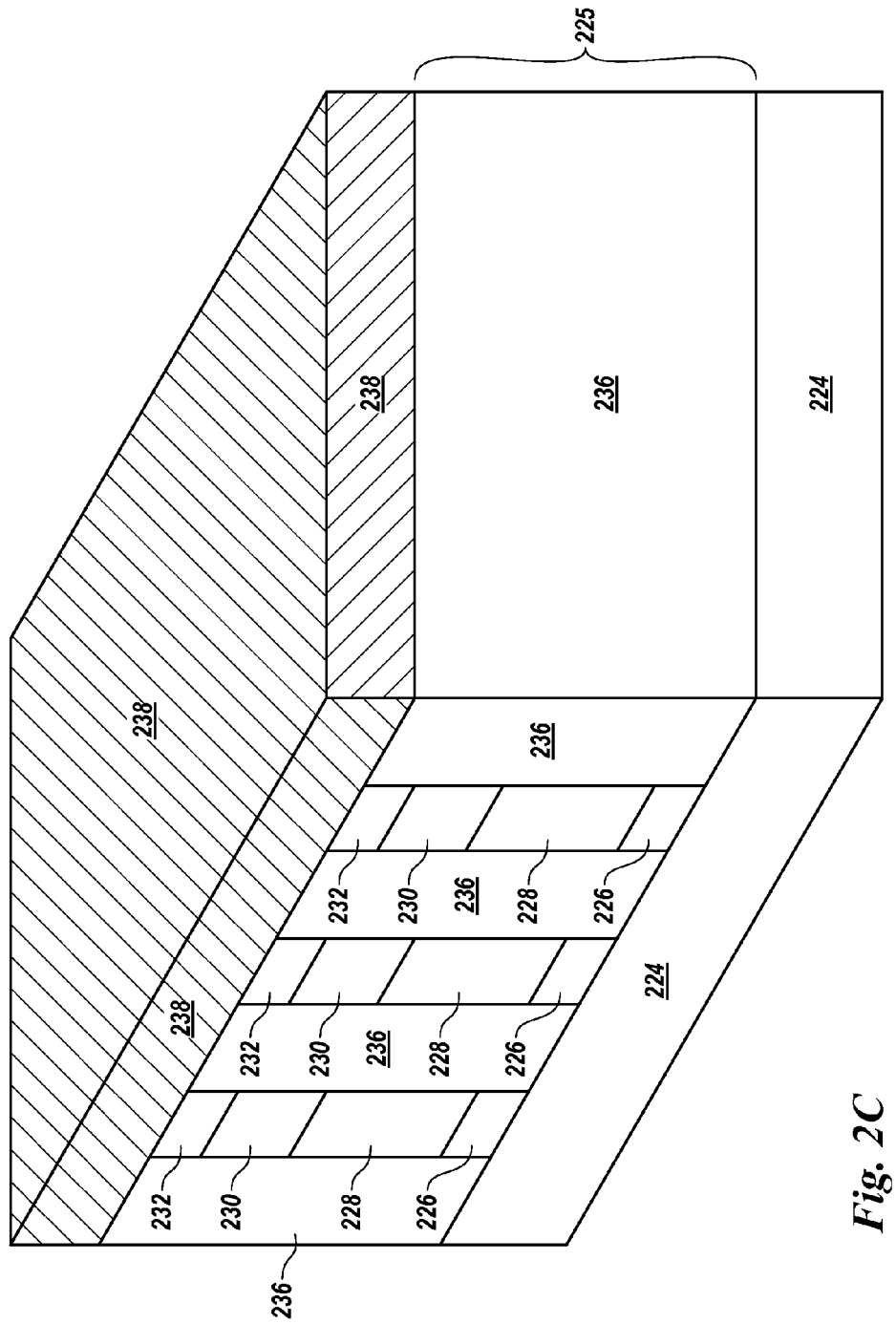

FIG. 2C illustrates the semiconductor structure 222 of FIG. 2B at a subsequent processing stage. As shown in FIG. 2C, the mask material shown in FIG. 2B at 234 can be removed along with some portion of the field oxide material 236, for example, down to the level of the semiconductor structure 225, e.g., top of material 232. Thereafter, a new mask material 238 can be deposited over exposed portions of semiconductor structure 225 and field oxide material 236. That is, mask material 238 can be deposited over exposed portions of material 232 and field oxide material 236 within the trenches.

Figure 2D:
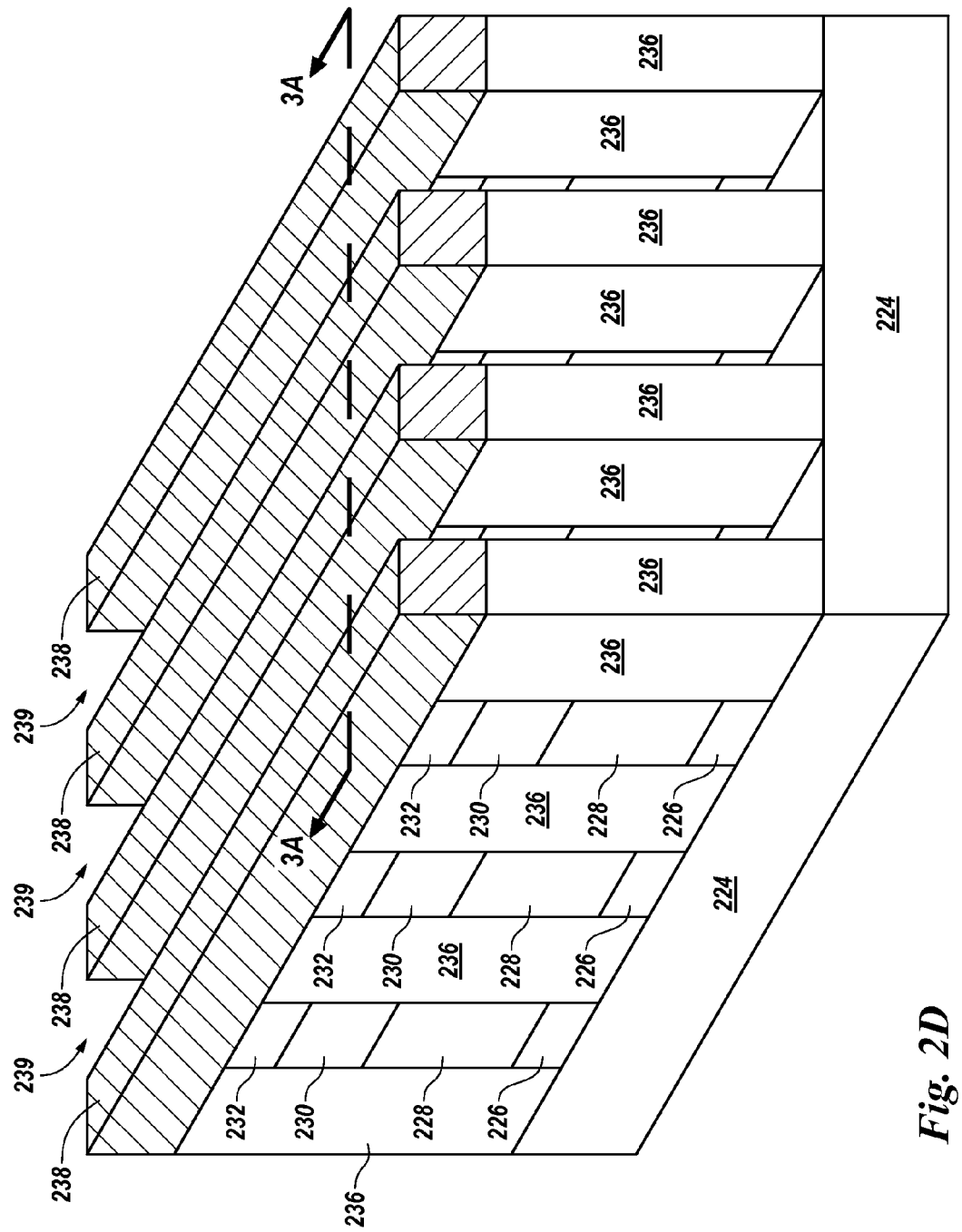

FIG. 2D illustrates the semiconductor structure 222 of FIG. 2C at a subsequent processing stage. As shown in FIG. 2D, one or more tranches, e.g., STI, can be formed in a direction substantially perpendicular to the trenches formed as described above. According to various embodiments, the trenches 239 can be formed in a word-line direction, which can be approximately perpendicular to the trenches previously formed in the bit-line direction. The trenches 239 can be formed, for example, by first etching the masking material 238, e.g., silicon nitride, and then etching the semiconductor materials, e.g., 226, 228, 230, 232, and the field oxide material 236. Forming the one or more trenches 239 can include etching the field oxide material 236 and the semiconductor materials 226, 228, 230, 232 down to the substrate 224, thereby forming a number of semiconductor pillars, as shown in FIG. 2D. In the example configuration shown in FIG. 2D, the semiconductor pillars are comprised of materials 226, 228, 230, and 232. The line structures formed by the formation of trenches 239 include alternating instances of semiconductor pillars and field oxide material 236 pillars.

Figure 3A:
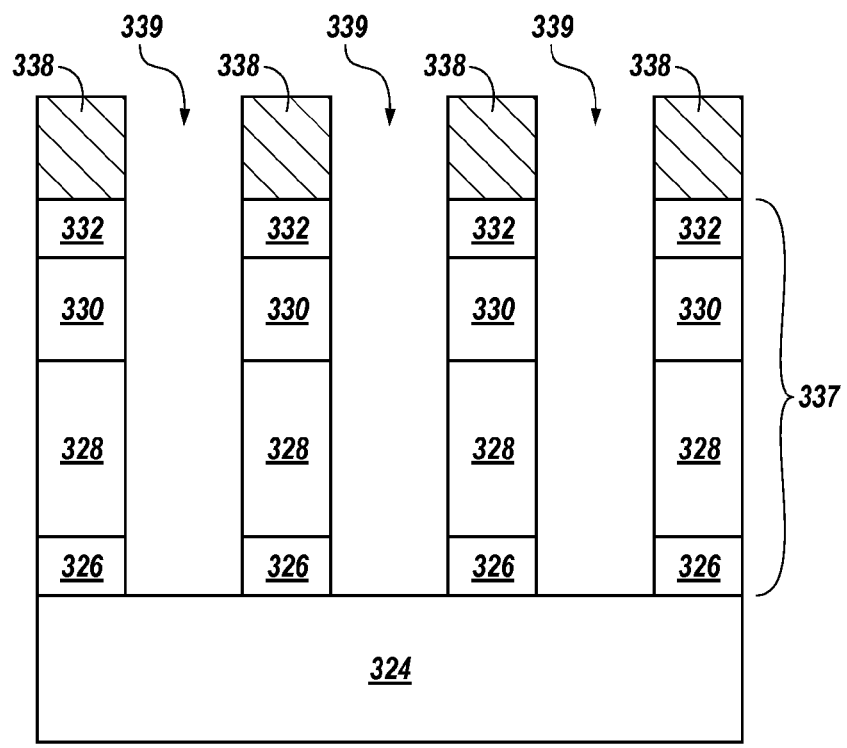
FIGS. 3A-3C illustrate cross-sectional views of various process stages associated with forming a vertical device.
Figure 3B:
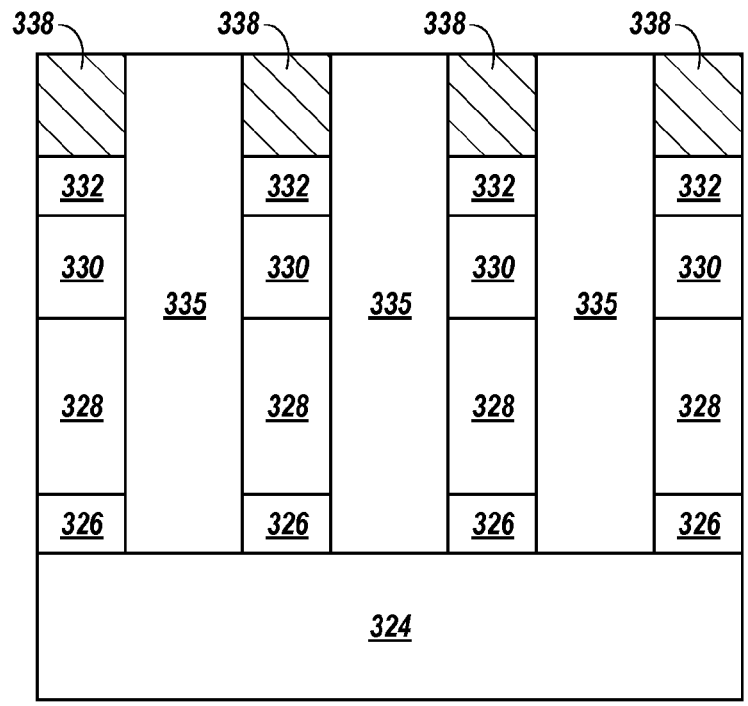
Figure 3C:
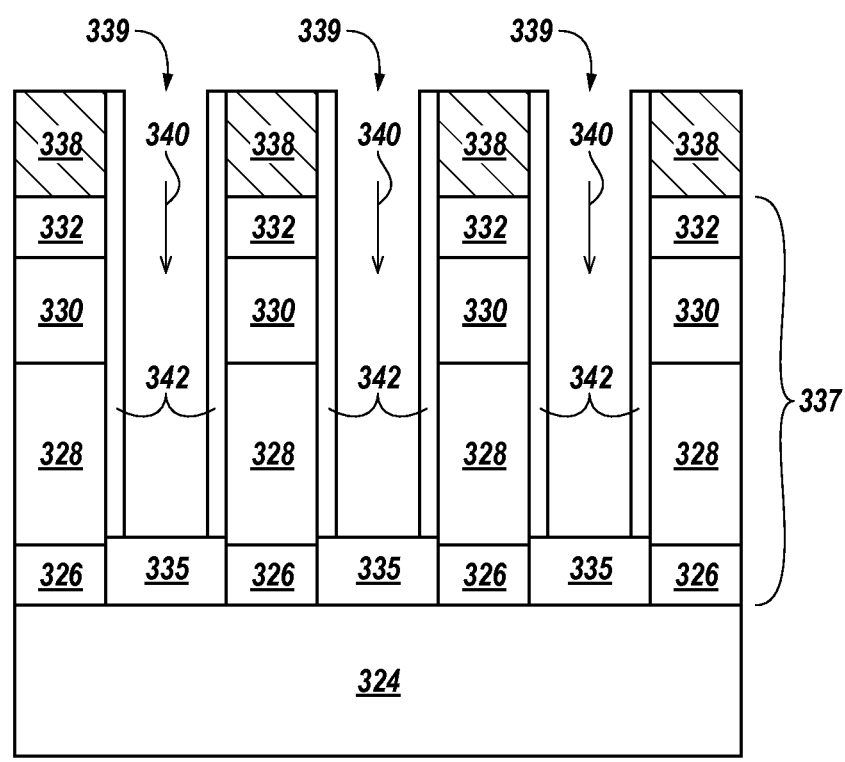

FIGS. 3A-3C illustrate cross-sectional views of various process stages associated with forming a vertical device. The cross-sectional view shown in FIG. 3A is taken according to the cut line 3A-3A shown in FIG. 2D. Therefore, FIG. 3A shows an end view of the line structures shown in FIG. 2D. The location of the cut line 3A-3A is such that the semiconductor pillars 337 of the line structures are shown in FIGS. 3A-3C.

The semiconductor pillars 337 comprising materials 326, material 328, material 330, and material 332 (corresponding to materials 226, 228, 230, and 232 respectively in FIGS. 2A-2D). FIG. 3A also shows mask material 338 (corresponding to material 238 in FIG. 2D) formed on each semiconductor pillar 337, thereby protecting the semiconductor materials 326, 328, 330, and 332 during the forming of the isolation trenches 339.

As an example, dielectric material could be formed in trenches 339 to a desired height, and subsequent features, e.g., gates, capacitors, etc. can be formed on the dielectric material as part of further memory device fabrication processing. However, forming a suitable dielectric material to a desired height within the trenches 339 can be difficult. More specifically, it can be difficult to deposit a suitable dielectric material at the bottom of trenches 339 to a desired height without also covering the walls of trenches 339, thus interfering with subsequent formation of additional features on the walls of trenches 339. It can also be difficult to deposit a suitable dielectric material into trenches 339 thereby filling trenches 339 and then to etch the deposited dielectric material in trenches 339 to a desired height without also etching into the walls of trenches 339.

For instance, as illustrated in FIG. 3B, the trenches 339 shown in FIG. 3A could be filled with an insulator material 335, such as silicon oxide. Thereafter, a planarization process, e.g., a chemical-mechanical polishing (CMP) process, can be performed on the semiconductor structure. The formation process could continue with portions of insulator material 335 being subsequently removed from trenches 339, such as by an etch and as indicated with arrow 340 shown in FIG. 3C, down to the level shown in FIG. 3C. Then features such as vertical gate structures 342 could be formed in trenches 339, e.g., on the surface of the recessed material 335 in the trenches 339, as shown in FIG. 3C. The level to which the insulator material 335 is removed can be, for example, associated with the level of a junction between materials 326 and 328. The vertical gate structure 342 might include a gate dielectric and/or metal spacers, among various other features associated with fabricating a vertical memory device.

However, etching insulator material 335 from trenches 339 is problematic, thus the configuration shown in FIG. 3C cannot be directly achieved with an etch-back of insulator material 335. This is because, for instance, performing a wet etch, which is isotropic, consumes material in a horizontal, as well as vertical, directions. Therefore, if a wet etch is performed on the semiconductor structure of FIG. 3B, e.g., subsequent to the CMP process, in order to etch material 335, the wet etch may also consume some of field oxide material 236 shown in FIGS. 2B-2D between the semiconductor pillars 337, e.g., behind pillars 337 shown in FIG. 3A, which can be undesirable.

Alternatively, a dry etch, which is anisotropic, could be performed on the semiconductor structure of FIG. 3B to etch portions of material 335 from trenches 339. However, performing the dry etch can cause consumption of portions of the mask material 338, which may be undesirable due to subsequent processes associated with forming a vertical memory device, for example. FIG. 3C, therefore, shows a final configuration that is desired but that is problematic to directly obtain from a process point shown in FIG. 3B via a wet or dry etch.

FIGS. 4A-4D illustrate cross-sectional views of various process stages associated with forming a vertical device in accordance with embodiments of the present disclosure. One or more embodiments provide a method for partially filling isolation trenches in association with forming a vertical memory device. Various embodiments can be accomplished while avoiding drawbacks associated with previous approaches such as those described above in connection with FIGS. 3A-3C. For example, one or more embodiments can include partially filling an STI trench without unwanted consumption of a hard mask material and/or without unwanted consumption of field oxide material associated with a previously filled STI trench in an orthogonal direction. The process stage illustrated in FIG. 4A can represent a process stage performed after the process stage illustrated in FIG. 3A, e.g., in lieu of the process stages illustrated in FIGS. 3B and 3C.

Figure 4A:
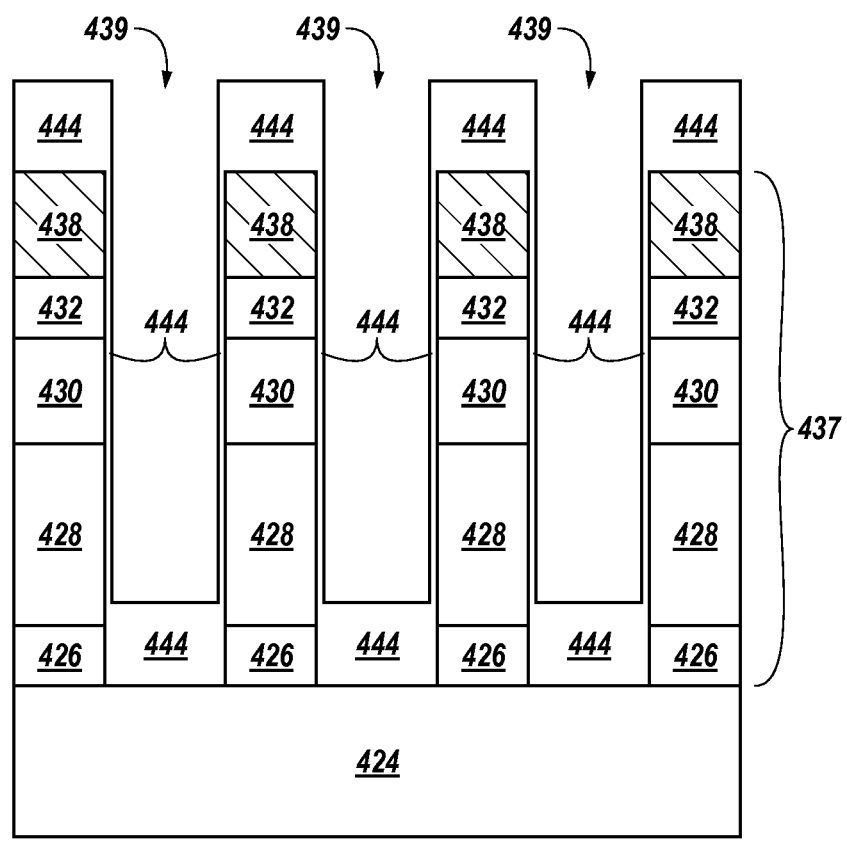
FIGS. 4A-4D illustrate cross-sectional views of various process stages associated with forming a vertical device in accordance with embodiments of the present disclosure.

FIG. 4A shows a side view of a number of semiconductor pillars 437 (corresponding to semiconductor pillars 337 shown in FIG. 3A). The pillars 437 comprise material 426, material 428, material 430, and material 432 (corresponding to materials 326, 328, 330, and 332, respectively, in FIG. 3A). FIG. 4A also shows mask material 438 (corresponding to material 338 in FIG. 3A) formed on each semiconductor pillar 437, thereby protecting the semiconductor materials 426, 428, 430, and 432 during the forming of the isolation trenches 439 (corresponding to trenches 339 in FIG. 3A).

After the trench formation illustrated in FIG. 3A, trenches 439 can be partially filled with an insulator material 444, as shown. For example, the insulator material 444 can be deposited by an anisotropic technique such as high density plasma (HDP) deposition. The insulator material 444 can be silicon dioxide (SiO$_2$), among other dielectric materials. Because HDP deposition is an anisotropic technique, insulator material 444 can be deposited to a controlled depth at the bottom of trenches 439 while little (if any) insulator material 444 is deposited on the sidewalls of trenches 439. That is, a small amount of insulator material 444 may be deposited on the sidewalls of pillars 437. However, some insulator material 444 can also be deposited over the mask material 438, e.g., silicon nitride lines, on top of the pillars 437 by the anisotropic deposition technique, as shown in FIG. 4A at 444.

Figure 4B:
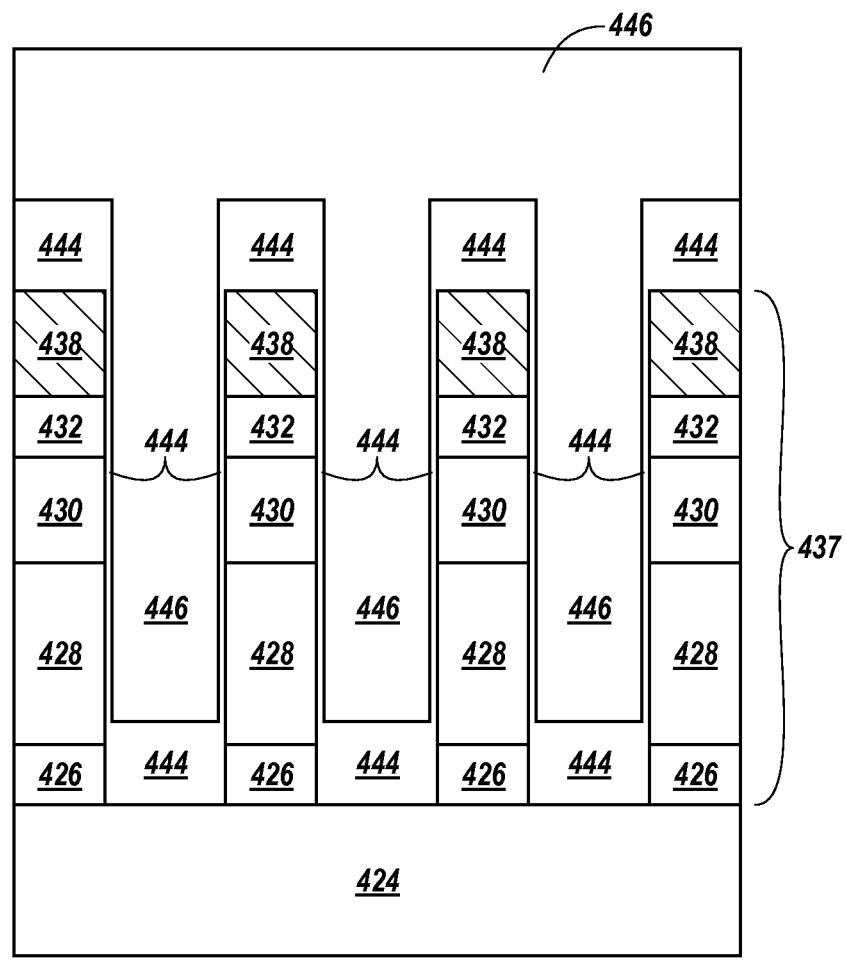

FIG. 4B illustrates the semiconductor structure of FIG. 4A at a subsequent processing stage. FIG. 4B shows a side view of the number of semiconductor pillars 437 subsequent to the HDP deposition of insulator material 444 shown in FIG. 4A. After the trenches 439 are partially filled, as described above with respect to FIG. 4A, a spin-on dielectric (SOD) material 446 can be formed over the insulator material 444, filling trenches 439 as shown. The SOD material 444 can be polysilazane, for example, which can be subsequently modified, e.g., converted, to an insulator material such as an oxide, e.g., silicon dioxide ($SiO_2$), for instance.

Conversion of the SOD material 446 to an oxide can occur via a low temperature anneal such that the wet etch rate of the modified SOD material 446 is high relative to the wet etch rate of a thermal oxide, such as the insulator material 444 after annealing. As an example, annealing SOD at approximately 1000° C. can result in conversion to a thermal oxide material. However, annealing SOD at a lower temperature such as within a range of about 300-400 ° C., for example, can provide increased wet etch rate of the modified SOD as compared to an SOD which undergoes an anneal at a higher temperature. Embodiments are not limited to a particular anneal temperature associated with converting the SOD 446 to an oxide. The particular anneal temperature can depend on factors such as the type of SOD 446 used, the etch rate of the insulator material 444, and/or an etch rate of the field oxide material, e.g., 236 shown in FIG. 2D, associated with the semiconductor structure, among other factors.

In one or more embodiments, the SOD material 446 can be annealed at the temperature such that a wet etch rate of the modified SOD material 446 corresponds to wet etch removal of SOD material 446 from trenches 439 at substantially the same time as the oxide 444 on sidewalls of the trenches 439 is removed. As an example, the SOD material 446 can be annealed at the temperature such that the annealed SOD material 446 has a wet etch rate between about 2 and about 4 times the wet etch rate of the oxide, e.g., oxide 444 and/or oxide 236 shown in FIG. 2D.

In some embodiments, the SOD material 446 can be annealed at a temperature such that the annealed SOD material 446 has a wet etch rate of at least about 10 times the wet etch rate of the oxide, e.g., oxide 444 and/or oxide 236 shown in FIG. 2D. For example, 10 nm of oxide 444, may need to be removed from sidewalls of trenches 439, and 100 nm to 1000 nm of sacrificial SOD material 446 may need to be removed from within the trench. As such, if the wet etch rate of the SOD material 446 is 10:1 to 100:1 greater than the wet etch rate of the oxide 444 on the sidewalls, a wet etch will result in the removal of both the oxide 444 on the sidewalls and the sacrificial SOD material 446 at approximately the same time.

As such, in various embodiments, the modified SOD material 446 serves as a sacrificial material that can be consumed in the vertical etching direction (thereby protecting the insulator material 444 at the bottom of the trench) while the unwanted insulator material 444 on the sidewalls of the trench is also being consumed in a horizontal direction. The wet etch rate of the modified SOD 446 can be controlled such that the modified SOD 446 within trenches 439 is consumed as the sidewall oxide 444 is substantially all consumed and before the oxide 444 at the bottom of the trench is consumed (or before the oxide 444 at the bottom of the trench is consumed beyond a desired final level).

Figure 4C:
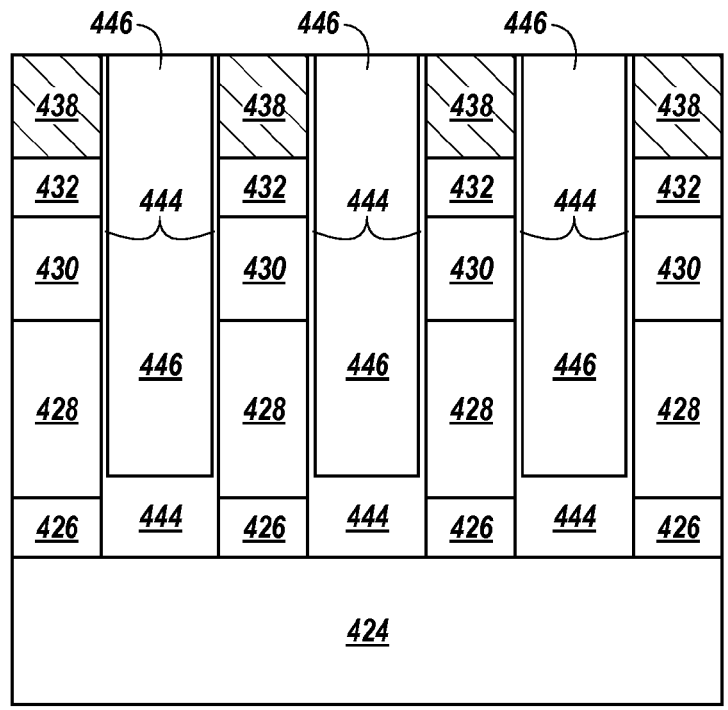

FIG. 4C illustrates the semiconductor structure of FIG. 4B at a subsequent processing stage. FIG. 4C illustrates the result of a planarization process, e.g., CMP, which can be performed subsequent to annealing of the SOD material 446. As illustrated, the CMP can stop on the mask material 438. For instance, the annealed SOD material 446 and insulator material 444 extending above the mask material 438 can be removed from above the semiconductor pillars and mask material 438, and removed from the trenches therebetween to a corresponding level, as shown in FIG. 4C.

A wet etch can then be used to remove the annealed SOD material 446 from trenches 439 as well as the insulator material 444 on the sidewalls of the trenches 439. Due to the relatively high wet etch rate of the annealed SOD material 446 as compared to the wet etch rate of the insulator material 444, the wet etch can have a selectively short duration, e.g., as compared to a case in which modified SOD material 446 were a thermal oxide. The wet etch rate of the annealed SOD material 446 can be controlled by adjusting the temperature at which the SOD material 446 is annealed, for instance. As an example, if annealed at a low temperature, e.g., below about 400° C., the annealed SOD material 446 will have a higher wet etch rate than if annealed at a high temperature, e.g., above about 600° C.

Since the wet etch rate of the annealed SOD material 446 can be controlled by adjusting the annealing temperature, the wet etch rate of the annealed SOD material 446 can be controlled such that it is higher than the wet etch rate of a thermal oxide. Therefore, the wet etch rate of the annealed SOD material 446 can be controlled, for instance, based on the depth of the annealed SOD material 446 in the trenches. The wet etch rate of the annealed SOD material 446 can also be controlled based on the thickness of oxide formed from the insulator material 444 on the sidewalls of the trenches 439. For example, the wet etch rate of the annealed SOD material 446 can be controlled such that it is greater than the wet etch rate of the oxide formed from the insulator material 444 on the sidewalls of the trenches 439. In this manner the removal of all of the annealed SOD material 446 from the trenches 439 and the insulator material 444 from the sidewalls of the trenches can occur at substantially the same time, which can leave the insulator material 444 on the bottom of the trenches un-etched at the desired height, e.g., at approximately the junction between material 426 and 428.

Effectively, the annealed SOD material 446 can act as a sacrificial material that can be consumed during a wet etch intended to remove the insulator material 444 on the sidewalls of the trenches 439. The sacrificial annealed SOD material 446 protects the insulator material 444 on the bottom of the trenches 439 during a wet etch to remove the insulator material 444 on the sidewalls of the trenches 439. By controlling the wet etch rate of the sacrificial annealed SOD material 446, e.g., by adjusting the annealing temperature, the sacrificial annealed SOD material 446 can be substantially fully consumed at substantially the same time during a wet etch that the insulator material 444 on the sidewalls of the trenches 439 is substantially consumed, resulting in the configuration shown in FIG. 4D.

Figure 4D:
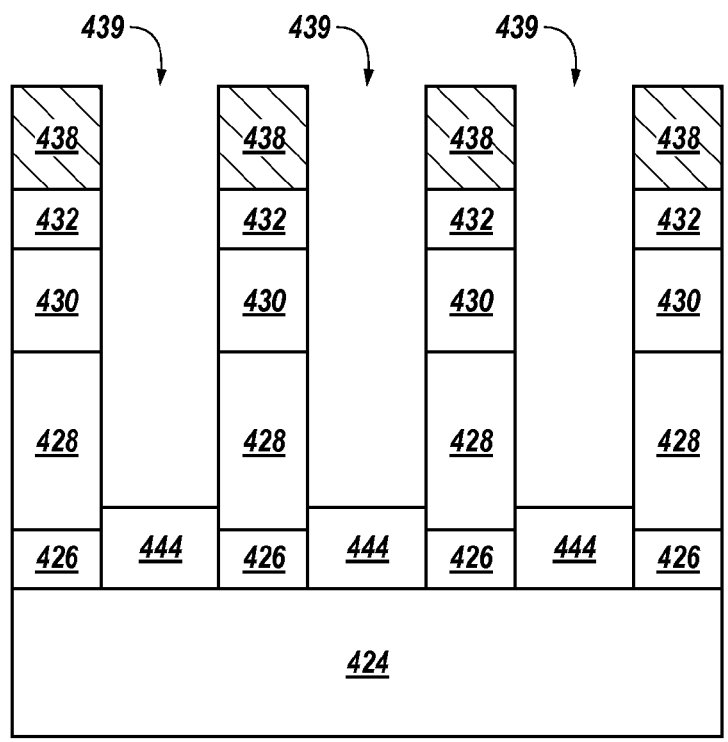

In one or more embodiments, some of the insulator material 444 at the bottom of the trench 439 may, or may not, be consumed. For instance, the insulator material 444 deposited at the bottom of the trench 439 during the partial fill process described in connection with FIG. 4A, may be at a level higher than desired for a final configuration. As such, some portion of the insulator material 444 at the bottom of the trench 439 can be consumed, e.g., also sacrificed, during the wet etch resulting in the configuration of FIG. 4D so that the remaining portion of the insulator material 444 deposited at the bottom of the trench 439 after the wet etch is at the desired level. While the final level of the insulator material 444 at the bottom of the trench 439 is shown in FIG. 4D being slightly above the level of a junction between material 426 and 428, embodiments of the present disclosure are not so limited. For example, the final level of the insulator material 444 at the bottom of the trench 439 can be higher along the semiconductor pillar than the junction between material 426 and 428, or lower, as the fabrication and/or configuration of the particular vertical memory cell dictates.

Further processing can occur to the semiconductor structure shown in FIG. 4D, e.g., to complete a vertical memory cell, such as vertical memory cell 100 shown in FIG. 1. According to some embodiments, the further vertical memory cell fabrication can include a gate dielectric formed, e.g., deposited, on the sidewalls and floor of trench 439. That is, the gate dielectric material can be deposited over insulator material 444 at the floor of trench 439.

Subsequent to the formation of the gate dielectric material on the sidewalls of trench 439, a conductive material can be deposited over the gate dielectric material on sidewalls of trench 439. According to some embodiments, the conductive material can be a metal. The conductive material can be a control gate electrode configured to be a word line for the vertical memory cell, for instance. Deposition of the conductive material can cause conductive material to also be deposited on the floor of trench 439, e.g., over any gate dielectric material also deposited on the floor of trench 439 over the insulator material 444. A spacer etch can be used to isolate the conductive material on the sidewalls of trench 439 from each other, e.g., so as to separate the gate word lines on adjacent sidewalls of trench 439 from one another. Doping of various regions, e.g., 426, 428, 430, 430, and/or formation of a contact material and a conductive, e.g., metal, material over the semiconductor materials can subsequently occur, e.g., formation of materials 114 and 116 shown in FIG. 1.

According to some embodiments, other memory cell components may be formed in addition to, or in lieu of, the configuration shown in FIG. 4D. That is, the vertical device configuration may be different than that shown in FIG. 1. For example, the number of semiconductor doped materials may be different, or differently doped, or arranged differently, or have different dimensions. A capacitor or various other structures may be formed over the semiconductor pillars and/or in the trenches 439. For example, the vertical device may have one gate structure, or more than one gate structure, e.g., two gate structures. The vertical device may be arranged and configured as T-RAM device, a DRAM device, or other vertical device, such as a transistor.

Figure 5:
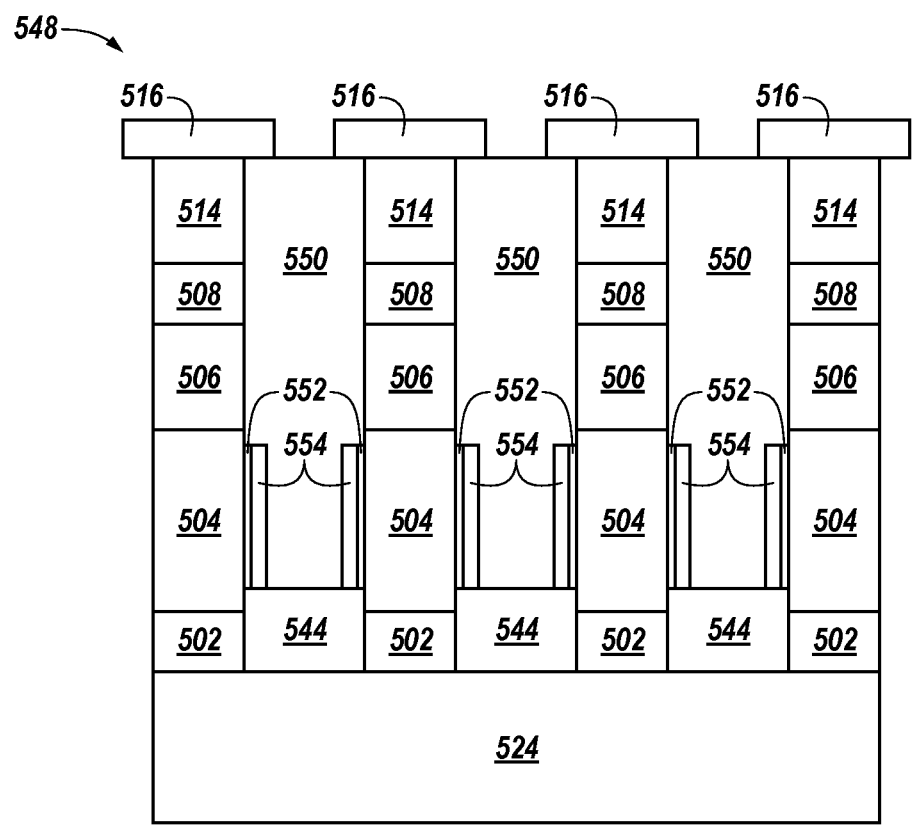
FIG. 5 illustrates a cross-sectional view of a process stage associated with forming a T-RAM vertical device in accordance with embodiments of the present disclosure.

FIG. 5 illustrates a cross-sectional view of a process stage associated with forming a T-RAM vertical device in accordance with embodiments of the present disclosure. FIG. 5 illustrates the semiconductor structure of FIG. 4D at a subsequent processing stage. FIG. 5 shows a side view of a number of semiconductor pillars. The pillars are fabricated on a substrate 524 (corresponding to material 424 in FIG. 4D) and are comprised of material 502, material 504, material 506, and material 508 (corresponding to materials 426, 428, 430, and 432, respectively, in FIG. 4D and can correspond to N+ doped material 102, P–doped material 104, N– doped material 106, and P+ doped material 108, respectively, in FIG. 1).

FIG. 5 shows that the mask material 438 shown in FIG. 4D has been removed by further processing, such as by a planarization process. A gate structure has been formed on the sidewalls of the trenches, e.g., trenches 439 shown in FIG. 4D), the gate structure including a gate dielectric 552 and a gate conductive material 554. A contact material 514 can be formed over material 508 on respective semiconductor pillars. The trenches can be filled with a second spin-on dielectric (SOD) material 550, around and over the gate structure and the insulator material 544 (corresponding to insulator material 444 in FIG. 4D). Any excess second SOD material 550 outside the trenches can be removed, for example, by a planarization process.

The second SOD material 550 can be annealed to form an oxide, for example. Thus, the trenches can contain two different materials, including the insulator material 544 and the second SOD material 550, which can both be silicon oxide, for example. Therefore, a vertical device fabricated according to the methods described herein can be detectable. That is, a SEM section and a staining etch can reveal the presence of two different silicon oxides in the trenches. A conductive material 516, e.g., metal, can be formed over the contact material 514, as shown in FIG. 5 to complete fabrication of a vertical memory device similar to that shown in FIG. 1.

Figure 6A:
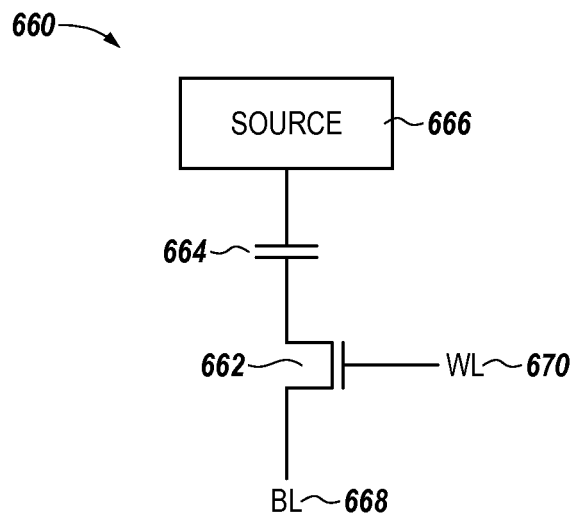
FIG. 6A illustrates a schematic diagram of a DRAM vertical device that can be formed in accordance with embodiments of the present disclosure.

FIG. 6A illustrates a schematic diagram of a DRAM vertical device that can be formed in accordance with embodiments of the present disclosure. FIG. 6A shows a DRAM vertical memory device 660 including a gated metal-oxide-semiconductor (MOS) type transistor 662 connected in series with a capacitor 664. The MOS transistor can be, for example a MOS field effect transistor (MOSFET), also known as an insulated gate transistor, having three terminals including a gate, a source and a drain. One terminal of the capacitor is connected to a source 666, e.g., voltage source, and one terminal of the gated MOS type transistor 662 can be connected to a bit line 668. A gate terminal of the gated MOS type transistor 662 can be connected to a word line 670.

Figure 6B:
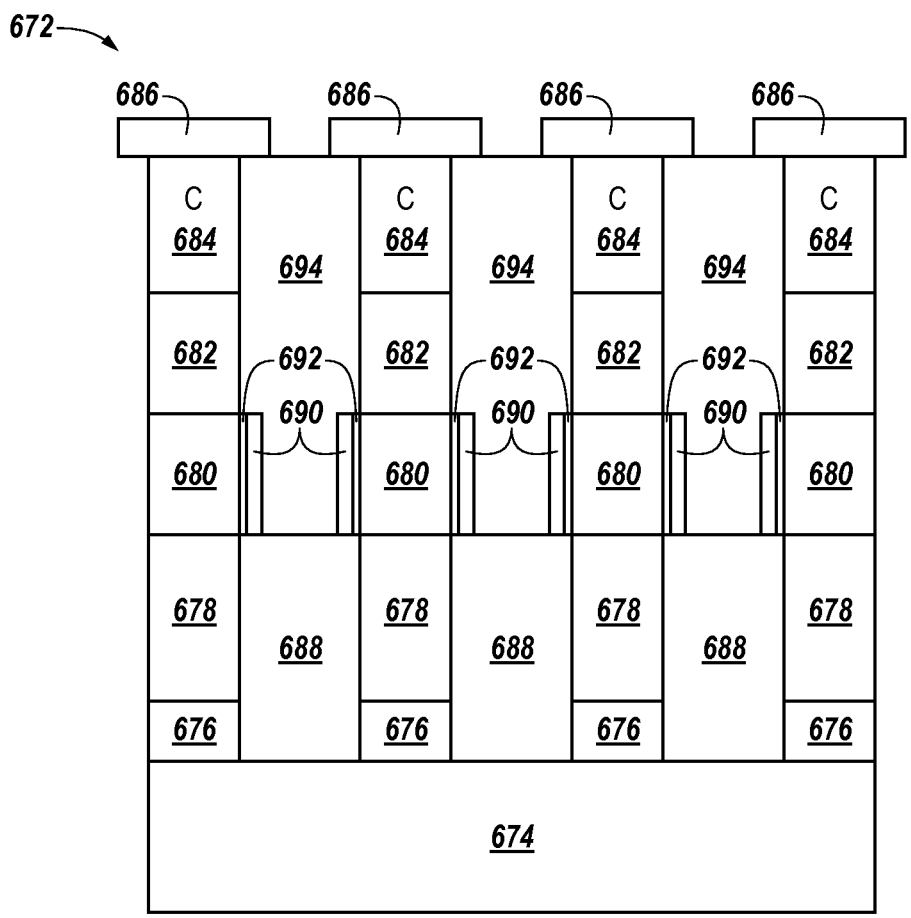
FIG. 6B illustrates a cross-sectional view of a process stage associated with forming a DRAM vertical device in accordance with embodiments of the present disclosure.

FIG. 6B illustrates a cross-sectional view of a process stage associated with forming a DRAM vertical device in accordance with embodiments of the present disclosure. FIG. 6B shows a side view of a number of semiconductor pillars. The pillars are fabricated on a substrate 674 (corresponding to material 424 in FIG. 4D) and are comprised of material 678, material 680, and material 682. The pillars can be fabricated in a manner similar to that described with respect to the semiconductor pillars shown in FIG. 4D, but with a different quantity, doping and arrangement than that which comprises the semiconductor pillars shown in FIG. 4D. For example, material 678 can be an N+ doped material, material 680 can be a P–doped material, and material 682 can be an N+ doped material.

The vertical devices that can be formed in accordance with embodiments of the present disclosure is not limited to the particular device and/or configuration shown in FIG. 6B, and can include other field effect transistor configurations (n-channel and/or p-channel), thyristors, capacitors, floating gate devices, charge trap layers, diodes, memory device (including phase change and/or other variable-resistance materials), and/or resistors, for example. The vertical devices that can be formed in accordance with embodiments of the present disclosure can include one or more gate structures, or include some other type of structure formed on the material partially filling the STI trench. The vertical devices that can be formed in accordance with embodiments of the present disclosure can include devices having gate structures formed at more than one location in the vertical dimension by repeating the partial filling-sacrificial SOD-etching process several times at different heights, e.g., after forming a first gate structure in a trench, the trench can again be partially filled to a new height upon which a second gate structure can be formed.

A gate structure can be been formed on the sidewalls of the trenches, e.g., trenches between the semiconductor pillars, the gate structure including a gate dielectric 692 and a gate conductive material 690. A capacitor structure 684 can be formed over material 682 on respective semiconductor pillars. The trenches can be filled with a second spin-on dielectric (SOD) material 694, around and over the gate structure and the insulator material 688 (formed similar to insulator material 444 in FIG. 4D). Any excess second SOD material 694 outside the trenches can be removed, for example, by a planarization process.

The second SOD material 694 can be annealed to form an oxide, for example. Thus, the trenches can contain two different materials, including the insulator material 688 and the second SOD material 694, which can both be silicon oxide, for example. A conductive material 686, e.g., metal, can be formed over the capacitor structure 684, as shown in FIG. 6B to complete fabrication of the DRAM vertical memory device. The capacitor structure 684 can be a vertical capacitor, for example, and can include a discrete vertical connection between the capacitor structure 684 and the corresponding transistor structure.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A device, formed by:
forming a first insulator material in a trench;
forming a dielectric material in the trench over the first insulator material;
modifying the dielectric material into a second insulator material having an etch rate equal to or greater than an etch rate of the first insulator material; and
removing a portion of the first insulator material and completely removing the second insulator material to expose a portion of a sidewall of the trench.

2. The device of claim 1, wherein the trench is located between semiconductor pillars configured as a metal-oxide-semiconductor field effect transistor (MOSFET) body.

3. The device of claim 2, wherein the trench is partially filled to at least a level of a channel of the MOSFET body.

4. The device of claim 1, wherein the second insulator material has a wet etch rate between about 2 and about 4 times a wet etch rate of the first insulator material.

5. The device of claim 1, wherein the second insulator material has a wet etch rate of at least 10 times a wet etch rate of the first insulator material.

6. The device of claim 5, wherein the second insulator material has a wet etch rate equal to or less than 100 times a wet etch rate of the first insulator material.

7. The device of claim 1, wherein removing a portion of the first insulator material includes removing a portion of the first insulator material at a bottom of the trench.

8. The device of claim 1, wherein a semiconductor pillar having at least two differently-doped semiconductor materials with a junction therebetween are formed in the trench.

9. A device, formed by:
partially filling a trench formed in a semiconductor structure with a first insulator material to a controlled depth;
forming a dielectric material over the first insulator material;
modifying the dielectric material into a second insulator material having an etch rate equal to or greater than an etch rate of the first insulator material; and
removing a portion of the first insulator material and completely removing the second insulator material to expose a portion of a sidewall of the trench.

10. The device of claim 9, wherein partially filling the trench with the first insulator material includes depositing a thermal oxide into the trench.

11. The device of claim 9, wherein partially filling the trench with the first insulator material includes depositing silicon dioxide (SiO2) into the trench.

12. The device of claim 9, wherein the second insulator material is a same material as the first insulator material.

13. The device of claim 9, wherein forming the dielectric material over the first insulator material includes depositing polysilazane into the trench.

14. The device of claim 13, wherein modifying the dielectric material into the second insulator material includes converting the polysilazane into an oxide.

15. The device of claim 13, wherein modifying the dielectric material into the second insulator material includes converting the polysilazane into silicon dioxide (SiO2).

16. The device of claim 13, wherein modifying the dielectric material into the second insulator material includes annealing the dielectric material at a temperature below which the dielectric material is converted to a thermal oxide.

17. A device, comprising:
semiconductor pillars; and
a gate structure formed between the semiconductor pillars according to a method comprising:
forming a first insulator material between the semiconductor pillars, the first insulator material having a first wet etch rate;
forming a dielectric material between the semiconductor pillars over the first insulator material;
annealing the dielectric material into a second insulator material at a temperature that results in the second insulator material having a second wet etch rate equal to or greater than the first etch rate;
wet etching the second insulator material and a portion of the first insulator from between the semiconductor pillars; and
forming the gate structure adjacent sidewalls of the semiconductor pillars upon a remaining portion of the first insulator material,
wherein the temperature of annealing is selected such that wet etching results in removal of the second insulator material and the portion of the first insulator material on sidewalls of the semiconductor pillars at approximately a same time.

18. The device of claim 17, wherein the semiconductor pillars configured as a metal-oxide-semiconductor field effect transistor (MOSFET) body.

19. The device of claim 17, wherein a level to which the first insulator material is formed is selected such that wet etching results in removal of the second insulator material and the portion of the first insulator material on sidewalls of the semiconductor pillars at approximately a same time.

20. The device of claim 19, wherein the level is selected such that wet etching the second insulator material in a vertical direction exposes the remaining portion of the first insulator material therebelow at approximately a same time that all of the first insulator on sidewalls of the semiconductor pillars is consumed.

* * * * *